United States Patent
Kuroiwa et al.

(10) Patent No.: US 9,320,155 B2
(45) Date of Patent: Apr. 19, 2016

(54) CERAMIC SUBSTRATE COMPOSITE AND METHOD FOR MANUFACTURING CERAMIC SUBSTRATE COMPOSITE

(71) Applicant: PANASONIC INTELLECTUAL PROPERTY MANAGEMENT CO., LTD., Osaka (JP)

(72) Inventors: Taiji Kuroiwa, Kyoto (JP); Seiichi Nakatani, Osaka (JP); Yoshihisa Yamashita, Kyoto (JP); Susumu Sawada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 51 days.

(21) Appl. No.: 14/128,954

(22) PCT Filed: Dec. 21, 2012

(86) PCT No.: PCT/JP2012/084255
§ 371 (c)(1),
(2) Date: Dec. 23, 2013

(87) PCT Pub. No.: WO2013/161133
PCT Pub. Date: Oct. 31, 2013

(65) Prior Publication Data
US 2014/0131076 A1    May 15, 2014

(30) Foreign Application Priority Data

Apr. 27, 2012    (JP) ................... 2012-103429

(51) Int. Cl.
*H05K 3/46* (2006.01)
*H05K 1/03* (2006.01)
(Continued)

(52) U.S. Cl.
CPC ............ *H05K 3/4629* (2013.01); *H05K 1/0306* (2013.01); *H05K 3/22* (2013.01);
(Continued)

(58) Field of Classification Search
CPC ..... H05K 1/0306; H05K 3/4629; H01B 1/14; H01B 1/16; H01B 1/18
See application file for complete search history.

(56) References Cited

U.S. PATENT DOCUMENTS 6,465,742 B1 * 10/2002 Hiraoka et al. ............... 174/255
2002/0011659 A1    1/2002 Nishide et al.
(Continued)

FOREIGN PATENT DOCUMENTS

JP    2001-316169    11/2001
JP    2004-314447    11/2004
(Continued)

OTHER PUBLICATIONS

International Search Report (ISR) issued Apr. 2, 2013 in International (PCT) Application No. PCT/JP2012/084255.
(Continued)

*Primary Examiner* — Jeremy C Norris
(74) *Attorney, Agent, or Firm* — Wenderoth, Lind & Ponack, L.L.P.

(57) ABSTRACT

A ceramic substrate composite includes a conductor pattern composite and an insulating layer on a ceramic substrate. The ceramic substrate composite is formed such that the conductor pattern composite and the insulating layer are provided on the ceramic substrate with each other so that the insulating layer overlaps a part of the conductor pattern composite. The conductor pattern composite is composed of a conductor portion and an insulating portion that exists locally in the conductor portion, and the insulating portion is an insulating material that constitutes the insulating layer.

11 Claims, 5 Drawing Sheets

(51) Int. Cl.
   *H05K 3/40* (2006.01)
   *H05K 3/22* (2006.01)

(52) U.S. Cl.
   CPC ....... *H05K 3/4007* (2013.01); *H05K 2201/017* (2013.01); *H05K 2201/09481* (2013.01); *H05K 2201/09881* (2013.01); *H05K 2203/0139* (2013.01); *Y10T 29/49155* (2015.01)

(56) References Cited

U.S. PATENT DOCUMENTS

| | | | |
|---|---|---|---|
| 2003/0213614 A1* | 11/2003 | Furusawa et al. | 174/256 |
| 2005/0074627 A1 | 4/2005 | Ichiyanagi et al. | |
| 2007/0295982 A1* | 12/2007 | Ryu et al. | 257/99 |
| 2008/0087888 A1 | 4/2008 | Morisue | |
| 2010/0096178 A1 | 4/2010 | Kim et al. | |

FOREIGN PATENT DOCUMENTS

| | | |
|---|---|---|
| JP | 2004-319781 | 11/2004 |
| JP | 2005-72329 | 3/2005 |
| JP | 2005-136396 | 5/2005 |
| JP | 2008-124445 | 5/2008 |
| JP | 2010-98291 | 4/2010 |
| JP | 2010-263159 | 11/2010 |

OTHER PUBLICATIONS

Notification of Transmittal of Translation of the International Preliminary Report on Patentability (IPROP) issued Nov. 6, 2014 in International (PCT) Application No. PCT/JP2012/084255, together with English translation of IPROP and English translation of Written Opinion.

* cited by examiner

CERAMIC SUBSTRATE COMPOSITE AND METHOD FOR MANUFACTURING CERAMIC SUBSTRATE COMPOSITE

TECHNICAL FIELD

The present invention relates to a ceramic substrate composite, and a method for manufacturing a ceramic substrate composite.

BACKGROUND ART

A ceramic substrate is excellent in heat resistance and moisture resistance, and also has satisfactory frequency characteristic in a high frequency circuit. Therefore, the ceramic substrate is used as an RF module for mobile devices, a substrate for power LEDs utilizing heat dissipation properties, and a substrate for LED backlights of liquid crystals. A ceramic substrate composite with a conductor pattern formed on the ceramic substrate is used as a core substrate of a build-up substrate. A build-up layer to be provided on the ceramic substrate composite is formed using thin film formation technology such as a sputtering method, a CVD method, or a sol-gel method.

The build-up substrate is likely to be influenced by a state of contact between a surface of the ceramic substrate composite and the build-up layer. Namely, it is impossible to sufficiently ensure the state of contact between the surface of the ceramic substrate composite and the build-up layer if the ceramic substrate composite does not have a sufficiently flat surface. Therefore, there arises a problem that it is impossible to obtain characteristics of the build-up substrate in a stable manner and to sufficiently ensure insulation between the ceramic substrate composite and the build-up layer.

In order to solve such problem, the surface of the ceramic substrate composite is subject to glass coating to thereby flatten the surface of the ceramic substrate composite (Patent Document 1 and Patent Document 2). The surface of the ceramic substrate composite subjected to glass coating is polished to thereby expose the conductor pattern formed on the ceramic substrate.

Patent Document 1: JP 2005-136396 A
Patent Document 2: JP 2010-98291 A

PROBLEMS TO BE SOLVED BY THE INVENTION

Problems to be Solved by the Invention

However, polishing of the surface of the ceramic substrate composite subjected to glass coating is indispensable to expose the conductor pattern. Therefore, it is impossible to reconcile both the step of flattening the surface of the ceramic substrate composite and the step of exposing the conductor pattern, resulting in low productivity of the ceramic substrate composite.

Thus, an object of the present invention is to provide the ceramic substrate composite excellent in productivity, and a method for manufacturing the same, by reconciling both flattening of the surface of the ceramic substrate composite and exposure of the conductor pattern.

SUMMARY OF THE INVENTION

In order to achieve the above object, the present invention provides a ceramic substrate composite comprising, on a ceramic substrate, a conductor pattern composite and an insulating layer. The conductor pattern composite and the insulating layer are alternately provided on the ceramic substrate so that the insulating layer overlaps a part of the conductor pattern composite. The conductor pattern composite is composed of a conductor portion and an insulating portion that exists locally in the conductor portion, and the insulating portion is an insulating material that constitutes the insulating layer.

In order to achieve the above object, the present invention also provides a method for manufacturing a ceramic substrate composite comprising, on a ceramic substrate, a conductor pattern composite and an insulating layer. The method includes allowing an insulating layer material, that is applied so as to cover a conductor portion or a precursor thereof on the ceramic substrate, to wet the conductor portion or the precursor thereof and to repel from the conductor portion or the precursor thereof due to wettability to thereby expose the conductor pattern composite or a precursor thereof, thus forming the insulating layer adjacent to the conductor pattern composite on the ceramic substrate.

Effects of the Invention

According to a method for manufacturing a ceramic substrate composite of the present invention, it is possible to reconcile both flattening of the surface of the ceramic substrate composite and exposure of the conductor pattern composite. Therefore, it is possible to improve productivity of the ceramic substrate composite.

A ceramic substrate composite of the present invention comprises a ceramic substrate, a conductor pattern composite, and an insulating layer. The conductor pattern composite is composed of a conductor portion, and an insulating portion that locally exists in the conductor portion, thus enabling formation of an unevenness-free conductor pattern composite on a surface. Therefore, the surface of the conductor pattern composite can be made flush with the surface of the insulating layer, the conductor pattern composite and the insulating layer being formed on the ceramic substrate so as to come into contact with each other.

DETAILED DESCRIPTION OF THE INVENTION

First, a ceramic substrate composite of the present invention will be described. The "ceramic substrate composite" as used in the present invention refers to a composite (or an aggregate) of a ceramic substrate, and a conductor pattern composite and an insulating layer formed on the ceramic substrate. The "conductor pattern composite" as used in the present invention refers to a composite (or an aggregate) of a conductor portion, and an insulating portion that locally exists in the conductor portion. The "precursor of a ceramic substrate composite" as used in the present invention refers to a structural body obtained before formation of the ceramic substrate composite. Furthermore, the "precursor of a conductor pattern composite" refers to a structural body obtained before formation of the conductor pattern composite.

Figure 1A:
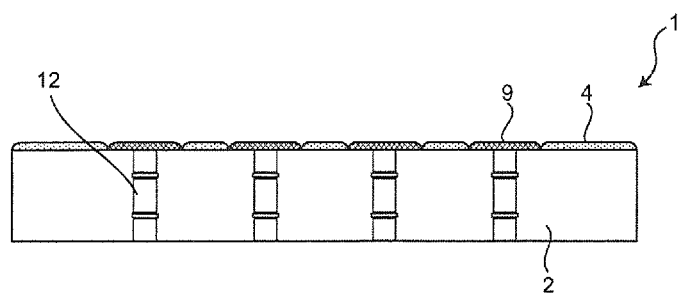
FIG. 1A a schematic cross-sectional view illustrating a ceramic substrate composite of the present invention.

FIG. 1A is a schematic cross-sectional view of a ceramic substrate composite 1 of the present invention. The ceramic substrate composite 1 of the present invention comprises a ceramic substrate 2, a conductor pattern composite 9, and an insulating layer 4. The conductor pattern composite 9 and the insulating layer 4 are formed on the ceramic substrate 2 so as to come into contact with each other. They are formed so that a surface of the conductor pattern composite 9 is flush with a surface of the insulating layer 4. Namely, the conductor pattern composite 9 has substantially the same thickness as that of the insulating layer 4. Therefore, one layer, i.e. a single layer is formed on the ceramic substrate 2.

Figure 1B:
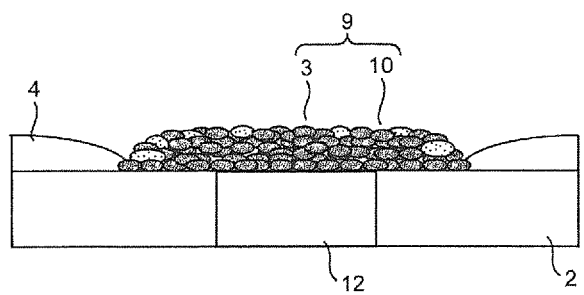
FIG. 1B an enlarged schematic cross-sectional view illustrating a ceramic substrate composite of the present invention.

FIG. 1B is an enlarged schematic cross-sectional view of a ceramic substrate composite 1 of the present invention. As illustrated in FIG. 1B, a conductor pattern composite 9 and an insulating layer 4 are in contact with each other on a ceramic substrate 2 so that the insulating layer 4 overlaps a part of the conductor pattern composite 9. Specifically, the conductor pattern composite 9 and the insulating layer 4 are in contact with each other on the ceramic substrate 2 so that the insulating layer 4 overlaps the peripheral portion of the conductor pattern composite 9. The conductor pattern composite 9 is provided on a via 12 formed in the ceramic substrate 2, and is also composed of a conductor portion 3 and an insulating portion 10. The conductor portion 3 comprises Ag, Cu, or Au sinterable particles, and the respective sinterable particles are in contact with each other. An average particle diameter of the sinterable particles is from about 1 μm to 20 μm, and preferably from about 1 μm to 10 μm. The "average particle diameter" as used herein substantially means a particle diameter determined by measuring each particle diameter of 300 particles based on electron micrographs or photomicrographs of the particles, followed by a number average calculation ("particle diameter" substantially refers to a maximum length among lengths of particles in all directions). In the conductor portion 3 formed by bringing sinterable particles into contact with each other, voids are locally formed. Especially, a large number of voids are formed on a surface of the conductor portion 3, and the insulating portion 10 locally exists in the conductor portion so as to fill the voids. The insulating portion 10 is composed of an insulating material that also constitutes the insulating layer 4. Since the conductor pattern composite 9 is composed of the conductor portion 3 and the insulating portion 10 that locally exists in the conductor portion 3, the surface of the conductor pattern composite 9 has an unevenness-free shape. Therefore, the surface of the conductor pattern composite 9 can be made flush with that of the insulating layer 4, the conductor pattern composite and the insulating layer being formed on the ceramic substrate 2 so as to come into contact with each other. As used herein, the phrase "surface of the conductor pattern composite 9 has an unevenness-free shape" substantially means that an arithmetic average roughness Ra of the surface of the conductor pattern composite 9 is 0.5 μm or less, and preferably 0.1 μm or less. The "arithmetic average roughness (Ra)" substantially means a value determined by sampling, from a measurement curve, only a reference length L in the direction of an average line, summing absolute values of the deviation of the sampled portion from the average line to the measurement curve, followed by averaging.

A method for manufacturing a ceramic substrate composite 1 of the present invention will be described below.

The method for manufacturing a ceramic substrate composite 1 of the present invention is characterized in that an insulating layer material, that covers a precursor of a conductor portion on a ceramic substrate, wets and repels (or wet-repels) the precursor of the conductor portion, thus moving to the direction of the insulating layer material applied on the ceramic substrate.

The method for manufacturing the ceramic substrate composite 1 of the present invention is mainly divided into two manufacturing methods. A difference between a first manufacturing method and a second manufacturing method is as follows. First, the first manufacturing method is characterized in that an insulating layer material having low wettability, that covers the precursor of the conductor portion on the ceramic substrate, wets and repels the precursor of the conductor portion, thus moving to the direction of the insulating layer material applied on the ceramic substrate to thereby expose a precursor of a conductor pattern composite. On the other hand, the second manufacturing method is characterized in that sintering is performed at a temperature in a range from a temperature higher than a sintering temperature of the precursor of the conductor portion formed on the ceramic substrate to a temperature lower than a sintering temperature of an insulating layer material, and the insulating layer material, that covers the conductor portion on the ceramic substrate, wets and repels the conductor portion, thus moving to the direction of the insulating layer material applied on the ceramic substrate to thereby expose the conductor pattern composite. The "wettability" as used herein refers to affinity of a liquid insulating layer material with the conductor portion or the precursor thereof. After making a description of a difference between the first manufacturing method and the second manufacturing method, each manufacturing method will be described below.

First, a first method for manufacturing a ceramic substrate composite 1 of the present invention will be described.

<First Manufacturing Method>
(Step of Forming Ceramic Substrate 2)

First, a green sheet as a sheet-like member comprising a ceramic component, a glass component, and an organic binder component is formed. The ceramic component may be an alumina powder (average particle diameter: about 0.5 to 10 μm). The glass component may be a borosilicate glass powder (average particle diameter: about 1 to 20 μm). The organic binder component may be, for example, at least one component selected from the group consisting of a polyvinyl butyral resin, an acrylic resin, a vinyl acetate copolymer, a polyvinyl alcohol, and a vinyl chloride resin. For illustrative purposes only, the green sheet may comprise 40 to 50% by weight of an alumina powder, 30 to 40% by weight of a glass powder, and 10 to 30% by weight of an organic binder component. A weight ratio of a solid component and an organic binder component, that constitute the green sheet, may be from about 80 to 90:10 to 20. The solid component constituting the green sheet comprises 50 to 60% by weight of an alumina powder and 40 to 50% by weight of a glass powder. The green sheet may also comprise other components and may comprise, for example, plasticizers for imparting flexibility to the green sheet, such as a phthalic acid ester and dibutyl phthalate, dispersants (for example, ketones such as glycol), organic solvents, and the like. The thickness of the green sheet may be about 30 μm to 500 μm, for example, about 60 to 350 μm.

A precursor of a via 12 for interlayer connection may also be formed by forming a hole in the green sheet, for example, by an NC punch press or a carbon dioxide laser, and filling the hole with a conductive paste. The precursor of the via 12 for interlayer connection may also be formed on the green sheet. The material of the precursor of the via 12 may be a material that is conventionally used and employed as a package wiring substrate of a semiconductor integrated circuit LSI. For example, the material of the precursor of the via 12 may be a material comprising an Ag powder, a glass frit for obtaining the bonding strength, and an organic vehicle, for example, an organic mixture of ethyl cellulose and terpineol.

Figure 2A:
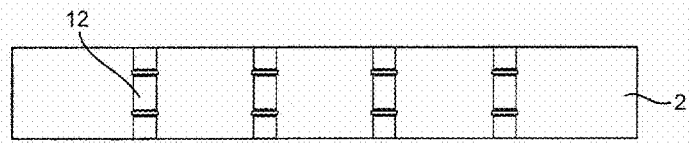
FIG. 2A is a schematic cross-sectional view illustrating a state where a ceramic substrate has been formed by the step of forming a ceramic substrate in a first method for manufacturing a ceramic substrate composite of the present invention.

At least two green sheets are laid one upon another, followed by application of a pressure and further a heating treatment under temperature conditions of 800° C. to 1,000° C., and preferably 850° C. to 950° C. for about 0.1 to 3 hour to form a ceramic substrate 1 with a via 12 as illustrated in FIG. 2A.

(Step of Forming Precursor 7 of Conductor Portion 3)

Figure 2B:
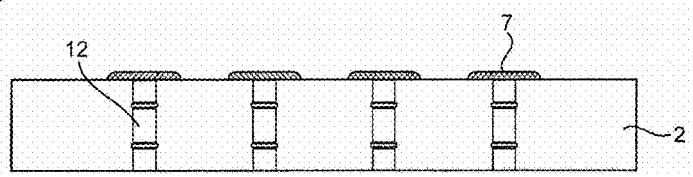
FIG. 2B is a schematic cross-sectional view illustrating a state where a precursor of a conductor portion has been formed by the step of forming a precursor of a conductor portion in a first method for manufacturing a ceramic substrate composite of the present invention.

Then, as illustrated in FIG. 2B, using a screen printing method, a conductive paste is printed in a desired pattern to form a precursor 7 of a conductor portion 3. The material of the precursor 7 of the conductor portion 3 may be a material that is conventionally used and employed as a package wiring substrate of a semiconductor integrated circuit LSI. For example, the material of the precursor 7 of the conductor portion 3 may be a material comprising Ag, Cu, or Au particles, a glass frit for obtaining the bonding strength, and an organic vehicle, for example, an organic mixture of ethyl cellulose and terpineol. At this time, Ag, Cu, or Au particles are not sinterable particles.

(Step of Applying Insulating Layer Material 5)

Figure 2C:
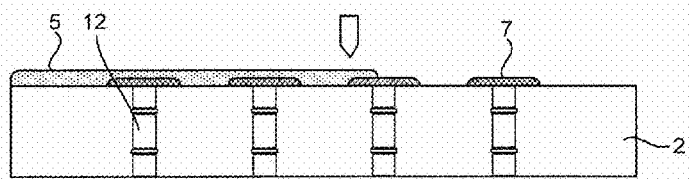
FIG. 2C is a schematic cross-sectional view illustrating a state where an insulating layer material has been applied by the step of applying an insulating layer material in a first method for manufacturing a ceramic substrate composite of the present invention.

Then, as illustrated in FIG. 2C, on the ceramic substrate 1 with the precursor 7 of the conductor portion 3 formed thereon, an insulating layer material 5 is applied so as to cover the precursor 7 of the conductor portion 3 using a squeegee. The "insulating layer material 5" in the first manufacturing method refers to a material obtained by dispersing an inorganic component having insulation properties comprising $SiO_2$ or $AlO_3$ in a resin composition, the material having low wettability to the precursor 7 of the conductor portion 3. In order to lower the wettability to the precursor 7 of the conductor portion 3, the resin composition contains at least one selected from a fluorine-based resin, a silicon-based resin, an imide-based resin, and an epoxy-based resin in an organic mixture of ethyl cellulose and terpineol. The insulating layer material 5 preferably has a viscosity enough to enable uniform application on whole surface of a ceramic surface.

(Step of Exposing Precursor 11 of Conductor Pattern Composite 9)

Figure 2D:
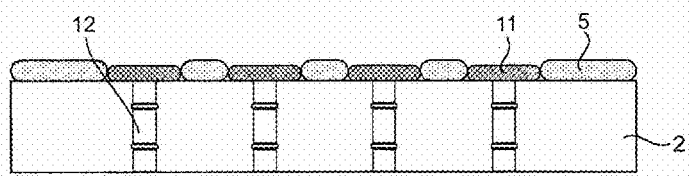
FIG. 2D is a schematic cross-sectional view illustrating a state where a precursor of a conductor pattern composite has been exposed by the step of exposing a precursor of a conductor pattern composite in a first method for manufacturing a ceramic substrate composite of the present invention.

After being left to stand in the place that is horizontal and is free from vibration for about 5 to 10 minutes, an insulating layer material 5, that covers the precursor 7 of the conductor portion 3, moves in the direction of the insulating layer material applied on a ceramic substrate by allowing the insulating layer material 5, that covers the precursor 7 of the conductor portion 3, to wet the precursor 7 of the conductor portion 3 and to repel from the precursor 7 of the conductor portion 3 due to wettability. Whereby, as illustrated in FIG. 2D, a precursor of a conductor pattern composite 9 is exposed from the insulating layer material 5 to obtain a precursor of a ceramic substrate composite 1. At this time, the insulating layer material 5 penetrates into a void formed locally between Ag, Cu, or Au particles that constitute the precursor 7 of the conductor portion 3 which are in contact with each other, without any clearance, to form a precursor 8 of an insulating portion 10. Therefore, an uneven portion is not formed on a surface of the precursor 11 of the conductor pattern composite 9 comprising the precursor 7 of the conductor portion 3 and the precursor 8 of the insulating portion 10.

(Step of Heating Precursor of Ceramic Substrate Composite 1)

Figure 2E:
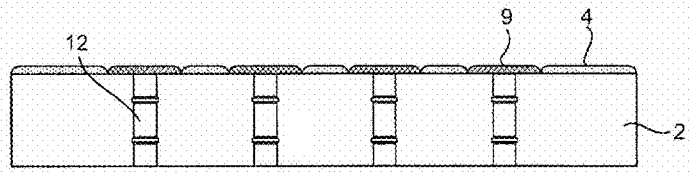
FIG. 2E is a schematic cross-sectional view illustrating a state where a ceramic substrate composite of the present invention has been formed by the step of heating a precursor of a ceramic substrate composite of the present invention in a first method for manufacturing a ceramic substrate composite of the present invention.

Then, as illustrated in FIG. 2E, the precursor of the ceramic substrate composite 1 is subjected to a heating treatment to obtain a ceramic substrate composite 1. Namely, by subjecting the precursor of the ceramic substrate composite 1 to the heating treatment, the precursor 11 of the conductor pattern composite 9 as a constituent thereof becomes the conductor pattern composite 9, and the insulating layer material 5 becomes an insulating layer 4, thus obtaining a ceramic substrate composite 1 comprising a ceramic substrate 2, a conductor pattern composite 9, and an insulating layer 4 (thickness of about 1.0 μm to 10.0 μm, and preferably about 1.0 μm to 3.0 μm). Regarding treatment conditions of the precursor of the ceramic substrate composite 1, a heating treatment is preferably performed in a BOX type combustion furnace under temperature conditions of 500° C. to 1,000° C., preferably under temperature conditions of 850° C. to 950° C. for about 0.1 hour to 3 hours.

At this time, the conductor pattern composite 9 and the insulating layer 4, that constitute the ceramic substrate composite 1, are formed on the ceramic substrate 2 so as to come into contact with each other. The conductor pattern composite 9 and the insulating layer 4 are formed so that a surface of the conductor pattern composite 9 is flush with a surface of the insulating layer 4. Namely, the conductor pattern composite 9 and the insulating layer 4 substantially form one layer on the ceramic substrate 2. Therefore, it is possible to flatten a surface of the ceramic substrate composite 1 and to increase the strength of the ceramic substrate composite 1, on the whole.

It is also possible to exert the following effects by flattening the surface of the ceramic substrate composite 1 and also increasing the strength of the ceramic substrate composite 1. Namely, it is possible to avoid poor connection between the ceramic substrate composite 1 and electronic parts when electronic parts such as semiconductors, semiconductors IC, circuit boards, module parts, or passive parts are mounted on the ceramic substrate composite 1.

As mentioned above, according to a method for manufacturing the ceramic substrate composite 1 of the present invention, it is possible to reconcile both flattening of a surface of a ceramic substrate composite and exposure of a conductor pattern composite 9. Therefore, it is possible to improve productivity of a ceramic substrate composite.

A second method for manufacturing a ceramic substrate composite 1 of the present invention will be described below.

<Second Manufacturing Method>

(Step of Forming Ceramic Substrate 2)

First, a green sheet as a sheet-like member comprising a ceramic component, a glass component, and an organic binder component is formed. The ceramic component may be an alumina powder (average particle diameter: about 0.5 to 10 μm). The glass component may be a borosilicate glass powder (average particle diameter: about 1 to 20 μm). The organic binder component may be, for example, at least one component selected from the group consisting of a polyvinyl butyral resin, an acrylic resin, a vinyl acetate copolymer, a polyvinyl alcohol, and a vinyl chloride resin. For illustrative purposes only, the green sheet may comprise 40 to 50% by weight of an alumina powder, 30 to 40% by weight of a glass powder, and 10 to 30% by weight of an organic binder component. A weight ratio of a solid component and an organic binder component, that constitute the green sheet, may be from about 80 to 90:10 to 20. The solid component constituting the green sheet comprises 50 to 60% by weight of an alumina powder and 40 to 50% by weight of a glass powder. The green sheet may also comprise other components, for example, plasticizers for imparting flexibility to the green sheet, such as a phthalic acid ester and dibutyl phthalate, dispersants (for example, ketones such as glycol), organic solvents, and the like. The thickness of the green sheet may be about 30 μm to 500 μm, for example, about 60 to 350 μm.

The precursor of the via 12 for interlayer connection may also be formed by forming a hole in the green sheet, for example, by an NC punch press or a carbon dioxide laser, and filling the hole with a conductive paste. The precursor of the via 12 for interlayer connection may also be formed on the green sheet. The material of the precursor of the via 12 may be a material that is conventionally used and employed as a package wiring substrate of a semiconductor integrated circuit LSI. For example, the material of the precursor of the via 12 may be a material comprising an Ag powder, a glass frit for obtaining the bonding strength, and an organic vehicle, for example, an organic mixture of ethyl cellulose and terpineol.

Figure 3A:
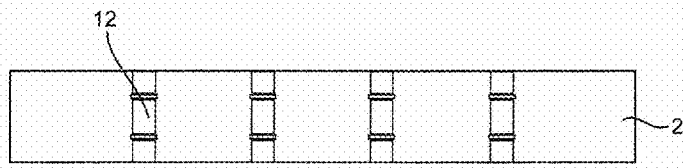
FIG. 3A is a schematic cross-sectional view illustrating a state where a ceramic substrate has been formed by the step of forming a ceramic substrate in a second method for manufacturing a ceramic substrate composite of the present invention.

At least two green sheets obtained are laid one upon another, followed by application of a pressure and further a heating treatment under temperature conditions of 800° C. to 1,000° C., and preferably 850° C. to 950° C. for about 0.1 to 3 hour to form a ceramic substrate 1 with a via 12, as illustrated in FIG. 3A.

(Step of Forming Precursor 7 of Conductor Portion 3)

Figure 3B:
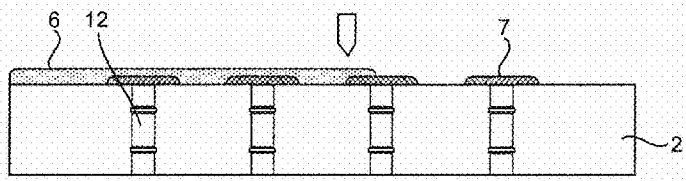
FIG. 3B is a schematic cross-sectional view illustrating a state where a precursor of a conductor portion has been formed by the step of forming a precursor of a conductor portion in a second method for manufacturing a ceramic substrate composite of the present invention.

Then, as illustrated in FIG. 3B, using a screen printing method, a conductive paste is printed in a desired pattern to form the precursor 7 of the conductor portion 3. The material of the precursor 7 of the conductor portion 3 may be a material that is conventionally used and employed as a package wiring substrate of a semiconductor integrated circuit LSI. For example, the material of the precursor 7 of the conductor portion 3 may be a material comprising Ag, Cu, or Au particles, a glass frit for obtaining the bonding strength, and an organic vehicle, for example, an organic mixture of ethyl cellulose and terpineol. Furthermore, the material of the precursor 7 of the conductor portion 3 preferably comprises Ag, Cu, or Au particles of 10 to 100 nm.

(Step of Applying Insulating Layer Material)

Figure 3C:
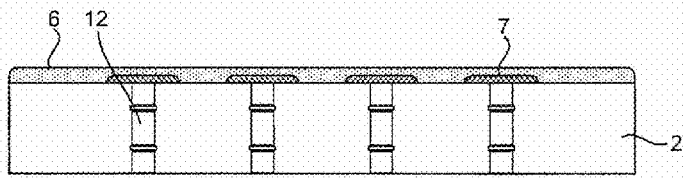
FIG. 3C is a schematic cross-sectional view illustrating a state where an insulating layer material has been applied by the step of applying an insulating layer material in a second method for manufacturing a ceramic substrate composite of the present invention.

Then, as illustrated in FIG. 3C, on the ceramic substrate 1 with the precursor 7 of the conductor portion 3 formed thereon, an insulating layer material 6 is applied so as to cover the precursor 7 of the conductor portion 3 using a squeegee to form the precursor of the ceramic substrate composite 1. The "insulating layer material 6" in the second manufacturing method refers to a material obtained by dispersing an inorganic component having insulation properties comprising $SiO_2$ or $AlO_3$ in a resin composition, for example, an organic mixture of ethyl cellulose, a polyimide resin, Teflon (registered trademark) resin or an epoxy resin and terpineol. The insulating layer material 6 preferably has a viscosity enough to enable uniform application on whole surface of a ceramic surface.

(Step of Forming Conductor Pattern Composite 9/Step of Exposing Conductor Pattern Composite 9)

Figure 3D:
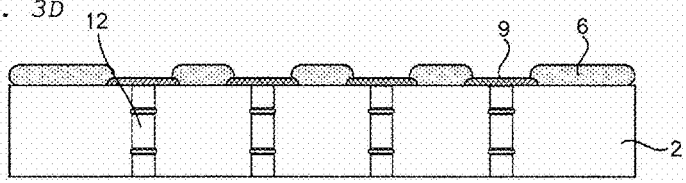
FIG. 3D is a schematic cross-sectional view illustrating a state where a conductor pattern composite has been exposed by the step of forming and exposing a conductor pattern composite in a second method for manufacturing a ceramic substrate composite of the present invention.

Then, a heating treatment of the precursor 7 of the conductor portion 3 is performed in a BOX type combustion furnace at a temperature in a range from a temperature higher than a sintering temperature of the precursor 7 of the conductor portion 3 to a temperature lower than a sintering temperature of an insulating layer material 6, specifically, at a temperature in a range from 300° C. to 500° C. for about 0.5 hour. This heating treatment enables formation of a conductor pattern composite 9. Together with formation of the conductor pattern composite 9, an insulating layer material 6, that covers the conductor portion 3, moves in the direction of the insulating layer material 6 applied on a ceramic substrate 2 by allowing the insulating layer material 6, that covers the conductor portion 3, to wet the conductor portion 3 and to repel from the conductor portion 3 due to wettability. Whereby, as illustrated in FIG. 3D, a conductor pattern composite 9 is exposed from the insulating layer material 6 that covers the conductor portion 3 to obtain the precursor of the ceramic substrate composite 1. At this time, in the case of wetting and repelling the conductor portion 3, the insulating layer material 6 penetrates into a void formed locally between Ag, Cu, or Au sinterable particles that constitute the conductor portion 3 and are in contact with each other, without any clearance, to form an insulating portion 10. Therefore, an uneven portion is not formed on a surface of the conductor pattern composite 9 comprising the conductor portion 3 and the insulating portion 10.

(Step of Heating Precursor of Ceramic Substrate Composite 1)

Figure 3E:
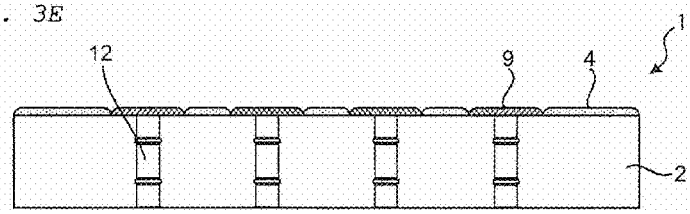
FIG. 3E is a schematic cross-sectional view illustrating a state where a ceramic substrate composite of the present invention has been formed by the step of heating a precursor of a ceramic substrate composite of the present invention in a second method for manufacturing a ceramic substrate composite of the present invention.

Then, the precursor of the ceramic substrate composite 1 is subjected to a heating treatment in a BOX type combustion furnace at a temperature higher than a sintering temperature of the insulating layer material 6, specifically at a temperature in a range from 500° C. to 1,000° C. for about 0.1 hour to 3 hours. Preferably, the precursor of the ceramic substrate composite 1 is subjected to a heating treatment in a BOX type combustion furnace at a temperature in a range from 850° C. to 950° C. for about 0.5 hour. The heating treatment of the precursor of the ceramic substrate composite 1 enables the insulating layer material 6 as a constituent of the precursor of the ceramic substrate composite 1 to form an insulating layer 4. That is, as illustrated in FIG. 3E, the heating treatment of the precursor of the ceramic substrate composite 1 enables production of a ceramic substrate composite 1 including a ceramic substrate 2, a conductor pattern composite 9, and an insulating layer 4 (thickness of about 1.0 μm to 10.0 μm, and preferably about 1.0 μm to 3.0 μm).

At this time, the conductor pattern composite 9 and the insulating layer 4, that constitute the ceramic substrate composite 1, are formed on the ceramic substrate 2 so as to come into contact with each other. The conductor pattern composite 9 and the insulating layer 4 are formed so that a surface of the conductor pattern composite 9 is flush with a surface of the insulating layer 4. Namely, the conductor pattern composite 9 and the insulating layer 4 substantially form one layer on the ceramic substrate 2. Therefore, it is possible to flatten a surface of the ceramic substrate composite 1 and to increase the strength of the ceramic substrate composite 1, on the whole.

It is also possible to exert the following effects by flattening the surface of the ceramic substrate composite 1 and also increasing the strength of the ceramic substrate composite 1. Namely, it is possible to avoid poor connection between the ceramic substrate composite 1 and electronic parts when electronic parts such as semiconductors, semiconductors IC, circuit boards, module parts, or passive parts are mounted on the ceramic substrate composite 1.

Examples of the present invention will be described below.

EXAMPLES

Example 1

Thickness of Insulating Layer Material 6: About 3.0 μm

First, an attempt was made to form a ceramic substrate composite 1 of the present invention by a second method for manufacturing a ceramic substrate composite 1 of the present invention.

(Step of Forming Ceramic Substrate 2)

First, a green sheet as a sheet-like member comprising a ceramic component, a glass component, and an organic binder component was formed. Then, at least two green sheets obtained were laid one upon another, followed by application of a pressure and further a heating treatment under temperature conditions of 850° C. to 950° C. to form a ceramic substrate 1.

(Step of Forming Precursor 7 of Conductor Portion 3)

Figure 4A:
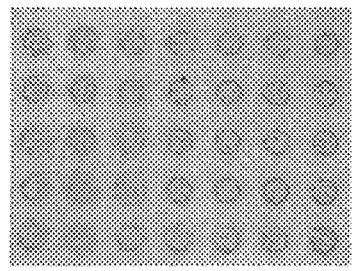
FIG. 4A is a planar photographic view illustrating a state where a precursor of a conductor portion has been formed by the step of forming a precursor of a conductor portion in a second method for manufacturing a ceramic substrate composite of the present invention.

Then, as illustrated in FIG. 4A, using a screen printing method, a conductive paste was printed in a desired pattern to form the precursor 7 of the conductor portion 3. The material of the precursor 7 of the conductor portion 3 comprises Ag particles comprising Ag particles of 10 to 100 nm, a glass frit for obtaining the bonding strength, and an organic vehicle such as an organic mixture of ethyl cellulose and terpineol.

(Step of Applying Insulating Layer Material 6)

Figure 4B:
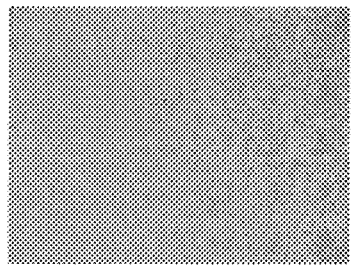
FIG. 4B is a planar photographic view illustrating a state where an insulating layer material has been applied by the step of applying an insulating layer material (thickness: 3.0 μm) in a second method for manufacturing a ceramic substrate composite of the present invention.

Then, as illustrated in FIG. 4B, on the ceramic substrate 1 with the precursor 7 of the conductor portion 3 formed thereon, an insulating layer material 6 (thickness: about 3.0 μm) was applied so as to cover the precursor 7 of the conductor portion 3 to an invisible degree, using a squeegee. This insulating layer material 6 is prepared by dispersing glass in a resin composition as an organic mixture of ethyl cellulose and terpineol.

(Step of Forming Conductor Pattern Composite 9/Step of Exposing Conductor Pattern Composite 9)

Then, a heating treatment of the precursor 7 of the conductor portion 3 was performed in a BOX type combustion furnace at a temperature in a range from 300° C. to 500° C. for 0.5 hour. By this heating treatment, a conductor pattern composite 9 was formed. Together with formation of the conductor pattern composite 9, the insulating layer material 6 (thickness: about 3.0 μm), that covers the conductor portion 3, was allowed to wet the conductor portion 3 and to repel from the conductor portion 3 due to wettability. Whereby, the conductor pattern composite 9 was exposed from the insulating layer material 6 that covers the conductor portion 3. As mentioned above, the precursor of a ceramic substrate composite 1 was obtained.

(Step of Heating Precursor of Ceramic Substrate Composite 1)

Then, the precursor of the ceramic substrate composite 1 was subjected to a heating treatment in a BOX type combustion furnace at a temperature in a range from 850° C. to 950° C. for about 0.5 hour. The heating treatment of the insulating layer material 6 enabled formation of an insulating layer 4.

Figure 4C:
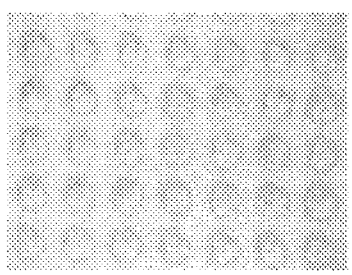
FIG. 4C is a planar photographic view illustrating a state where a ceramic substrate composite of the present invention has been formed by the step of heating a precursor of a ceramic substrate composite of the present invention in a second method for manufacturing a ceramic substrate composite of the present invention.
Figure 4D:
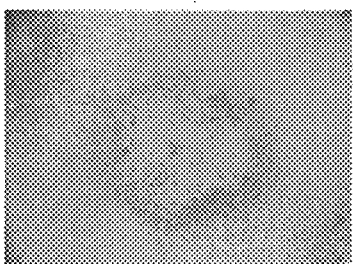
FIG. 4D is an enlarged planar photographic view illustrating a state where a ceramic substrate composite of the present invention has been formed by the step of heating a precursor of a ceramic substrate composite of the present invention in a second method for manufacturing a ceramic substrate composite of the present invention.

The steps mentioned above were carried out to obtain the ceramic substrate composite 1 of the present invention in which the conductor pattern composite 9 is exposed, as illustrated in FIG. 4C. As illustrated in FIG. 4D, it was confirmed that the conductor pattern composite 9 is exposed in the ceramic substrate composite 1 of the present invention.

Example 2

Thickness of Insulating Layer Material 6: About 10.0 µm

Figure 5A:
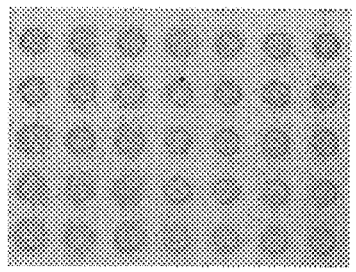
FIG. 5A is a planar photographic view illustrating a state where a precursor of a conductor portion has been formed by the step of forming a precursor of a conductor portion in a second method for manufacturing a ceramic substrate composite of the present invention.
Figure 5B:
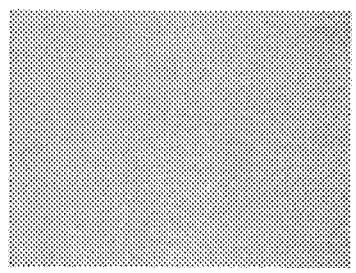
FIG. 5B is a planar photographic view illustrating a state where an insulating layer material (thickness: 10.0 μm) has been applied by the step of applying an insulating layer material in a second method for manufacturing a ceramic substrate composite of the present invention.

Then, an attempt was made to form a ceramic substrate composite 1 of the present invention by a second method for manufacturing a ceramic substrate composite 1 of the present invention.
(Step of Forming Ceramic Substrate 2)
First, a green sheet as a sheet-like member comprising a ceramic component, a glass component, and an organic binder component was formed. Then, at least two green sheets obtained were laid one upon another, followed by application of a pressure and further a heating treatment under temperature conditions of 850° C. to 950° C. to form a ceramic substrate 1.
(Step of Forming Precursor 7 of Conductor Pattern 3)
Then, as illustrated in FIG. 5A, using a screen printing method, a conductive paste was printed in a desired pattern to form the precursor 7 of the conductor portion 3. The material of the precursor 7 of the conductor portion 3 comprises Ag particles comprising Ag particles of 10 to 100 nm, a glass frit for obtaining the bonding strength, and an organic vehicle such as an organic mixture of ethyl cellulose and terpineol.
(Step of Applying Insulating Layer Material 6)
Then, as illustrated in FIG. 5B, on the ceramic substrate 1 with the precursor 7 of the conductor portion 3 formed thereon, an insulating layer material 6 (thickness: about 10.0 µm) was applied so as to cover the precursor 7 of the conductor portion 3 to an invisible degree, using a squeegee. This insulating layer material 6 is prepared by dispersing glass in a resin composition as an organic mixture of ethyl cellulose and terpineol.
(Step of Forming Conductor Pattern Composite 9/Step of Exposing Conductor Pattern Composite 9)
Then, a heating treatment of the precursor 7 of the conductor portion 3 was performed in a BOX type combustion furnace at a temperature in a range from 300° C. to 500° C. for By this heating treatment, a conductor pattern composite 9 was formed. Together with formation of the conductor pattern composite 9, the insulating layer material 6 (thickness: about 10.0 µm), that covers the conductor portion 3, was allowed to wet the conductor portion 3 and to repel from the conductor portion 3 due to wettability. Whereby, the conductor pattern composite 9 was exposed from the insulating layer material 6 that covers the conductor portion 3. As mentioned above, the precursor of the ceramic substrate composite 1 was obtained.
(Step of Heating Precursor of Ceramic Substrate Composite 1)
Then, the precursor of the ceramic substrate composite 1 was subjected to a heating treatment in a BOX type combustion furnace at a temperature in a range from 850° C. to 950° C. for about 0.5 hour. This heating treatment of the precursor of the ceramic substrate composite 1 enabled insulating layer material 6 to form an insulating layer 4.

Figure 5C:
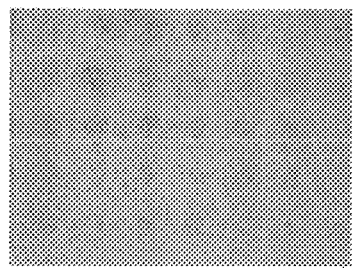
FIG. 5C is a planar photographic view illustrating a state where a ceramic substrate composite of the present invention has been formed by the step of heating a precursor of a ceramic substrate composite of the present invention in a second method for manufacturing a ceramic substrate composite of the present invention.

The steps mentioned above were carried out to obtain the ceramic substrate composite 1 of the present invention in which the conductor pattern composite 9 is exposed, as illustrated in FIG. 5C.

While the ceramic substrate composite 1 of the present invention and the method for manufacturing the ceramic substrate composite 1 of the present invention have been described above, it should be understood that the present invention is not limited thereto and various modifications can be made by those skilled in the art without departing from the scope of the present invention defined in claims.

The above-mentioned present invention includes the following aspects.
First Aspect:
A ceramic substrate composite comprising, on a ceramic substrate, a conductor pattern composite and an insulating layer,
wherein the conductor pattern composite and the insulating layer are provided on the ceramic substrate with each other so that the insulating layer overlaps a part of the conductor pattern composite; and wherein the conductor pattern composite is composed of a conductor portion and an insulating portion that exists locally in the conductor portion, and the insulating portion is an insulating material that constitutes the insulating layer.
Second Aspect:
The ceramic substrate composite according to the first aspect, wherein the conductor pattern composite and the insulating layer are provided on the ceramic substrate with each other so that the conductor pattern composite is flush with the insulating layer.
Third Aspect:
The ceramic substrate composite according to the first or second aspect, wherein the conductor pattern composite and the insulating layer constitute a single layer.
Fourth Aspect:
The ceramic substrate composite according to any one of first to third aspects, wherein the conductor pattern composite is provided on a via of the ceramic substrate.
Fifth Aspect:
The ceramic substrate composite according to any one of first to third aspects, wherein the insulating layer comprises an inorganic component.
Sixth Aspect:
The ceramic substrate composite according to the fifth aspect, wherein the inorganic component comprises $SiO_2$ or $AlO_3$.
Seventh Aspect:
The ceramic substrate composite according to any one of first to fourth aspects, wherein the conductor pattern composite comprises at least Ag, Cu, or Au particles.
Eighth Aspect:
The ceramic substrate composite according to the seventh aspect, wherein the Ag, Cu, or Au particles comprise Ag, Cu, or Au particles of 10 to 100 nm.
Ninth Aspect:
A method for manufacturing a ceramic substrate composite comprising, on a ceramic substrate, a conductor pattern composite and an insulating layer, the method comprising:
allowing an insulating layer material, that is applied so as to cover a conductor portion or a precursor thereof on the ceramic substrate, to wet the conductor portion or the precursor thereof and to repel from the conductor portion or the precursor thereof due to wettability to thereby expose the conductor pattern composite or a precursor thereof, thus forming the insulating layer adjacent to the conductor pattern composite on the ceramic substrate.
Tenth Aspect:
The method for manufacturing a ceramic substrate according to the ninth aspect, comprising the steps of:
(i) forming the precursor of the conductor portion on the ceramic substrate composite;
(ii) applying the insulating layer material having low wettability to the precursor of the conductor portion so as to cover the precursor of the conductor portion;

(iii) allowing the insulating layer material having low wettability, that covers the precursor of the conductor portion, to wet the precursor of the conductor portion and to repel from the precursor of the conductor portion to thereby expose the precursor of the conductor pattern composite, thus forming the precursor of the ceramic substrate composite; and (iv) heating the precursor of the ceramic substrate composite to form the insulating layer adjacent to the conductor pattern composite on the ceramic substrate.

Eleventh Aspect:

The method for manufacturing a ceramic substrate according to the ninth aspect, comprising the steps of:

(i) forming the precursor of the conductor portion on the ceramic substrate;

(ii) applying the insulating layer material so as to cover the precursor of the conductor portion;

(iii) heating at a temperature, that is higher than a sintering temperature of the precursor of the conductor portion and is also lower than a sintering temperature of the insulating layer material, to thereby allow the insulating layer material, that covers the conductor portion on the ceramic substrate, to wet the conductor portion and to repel from the conductor portion due to wettability while forming the conductor pattern composite, thus exposing the conductor pattern composite to form the precursor of the ceramic substrate composite; and (iv) heating the precursor of the ceramic substrate composite at a temperature higher than the sintering temperature of the insulating layer material to form the insulating layer adjacent to the conductor pattern composite on the ceramic substrate.

Twelfth Aspect:

The method for manufacturing a ceramic substrate according to any one of ninth to eleventh aspects, wherein the insulating layer adjacent to the conductor pattern composite is formed on the ceramic substrate so that the conductor pattern composite is flush with the insulating layer.

Thirteenth Aspect:

The method for manufacturing a ceramic substrate according to any one of ninth to twelfth aspects, wherein the insulating layer adjacent to the conductor pattern composite is formed on the ceramic substrate so that the insulating layer overlaps a part of the conductor pattern composite.

Fourteenth Aspect:

The method for manufacturing a ceramic substrate according to any one of ninth to thirteenth aspects, wherein the conductor pattern composite is provided on a via of the ceramic substrate.

Fifteenth Aspect:

The method for manufacturing a ceramic substrate according to any one of ninth to eleventh aspects, wherein the insulating layer material comprises an inorganic component and a resin composition.

Sixteenth Aspect:

The method for manufacturing a ceramic substrate according to the fifteenth aspect, wherein the inorganic component comprises $SiO_2$ or $AlO_3$.

Seventeenth Aspect:

The method for manufacturing a ceramic substrate according to the fifteenth aspect, wherein the resin composition comprises at least one selected from a fluorine-based resin, a silicon-based resin, an imide-based resin, and an epoxy-based resin.

Eighteenth Aspect:

The method for manufacturing a ceramic substrate according to any one of ninth to fourteenth aspects, wherein the conductor pattern composite comprises Ag, Cu, or Au particles.

Nineteenth Aspect:

The method for manufacturing a ceramic substrate according to the eighteenth aspect, wherein the Ag, Cu, or Au particles comprise Ag, Cu, or Au particles of 10 to 100 nm.

INDUSTRIAL APPLICABILITY

The ceramic substrate composite of the present invention is used, for example, as a core substrate of a build-up substrate for probe cards.

CROSS-REFERENCE TO RELATED APPLICATION

This application claims priority under the Paris Convention on Japanese Patent Application No. 2012-103429 filed on Apr. 27, 2012, titled "CERAMIC SUBSTRATE COMPOSITE AND METHOD FOR MANUFACTURING CERAMIC SUBSTRATE COMPOSITE", the content of which is incorporated by reference herein.

DESCRIPTION OF REFERENCE NUMERALS

1: Ceramic substrate composite
2: Ceramic substrate
3: Conductor portion
4: Insulating layer
5: Insulating layer material
6: Insulating layer material
7: Precursor of conductor portion
8: Precursor of insulating portion
9: Conductor pattern composite
10: Insulating portion
11: Precursor of conductor pattern composite
12: Via

The invention claimed is:

1. A method for manufacturing a ceramic substrate composite comprising, on a ceramic substrate, a conductor pattern composite and an insulating layer, the method comprising:
   allowing an insulating layer material, that is applied so as to cover a conductor portion or a precursor thereof on the ceramic substrate, to wet the conductor portion or the precursor thereof and to repel from the conductor portion or the precursor thereof due to wettability to thereby expose the conductor pattern composite or a precursor thereof, thus forming the insulating layer adjacent to the conductor pattern composite on the ceramic substrate.

2. The method for manufacturing a ceramic substrate according to claim 1, comprising the steps of:
   (i) forming the precursor of the conductor portion on the ceramic substrate composite;
   (ii) applying the insulating layer material having low wettability to the precursor of the conductor portion so as to cover the precursor of the conductor portion;
   (iii) allowing the insulating layer material having low wettability, that covers the precursor of the conductor portion, to wet the precursor of the conductor portion and to repel from the precursor of the conductor portion to thereby expose the precursor of the conductor pattern composite, thus forming the precursor of the ceramic substrate precursor; and
   (iv) heating the precursor of the ceramic substrate composite to form the insulating layer adjacent to the conductor pattern composite on the ceramic substrate.

3. The method for manufacturing a ceramic substrate according to claim 1, comprising the steps of:
   (i) forming the precursor of the conductor portion on the ceramic substrate;
   (ii) applying the insulating layer material so as to cover the precursor of the conductor portion;
   (iii) heating at a temperature, that is higher than a sintering temperature of the precursor of the conductor portion and is also lower than a sintering temperature of the insulating layer material, to thereby allow the insulating layer material, that covers the conductor portion on the ceramic substrate, to wet the conductor portion and to repel from the conductor portion due to wettability while forming the conductor pattern composite, thus exposing the conductor pattern composite to form the precursor of the ceramic substrate composite; and
   (iv) heating the precursor of the ceramic substrate composite at a temperature higher than the sintering temperature of the insulating layer material to form the insulating layer adjacent to the conductor pattern composite on the ceramic substrate.

4. The method for manufacturing a ceramic substrate according to claim 1, wherein the insulating layer adjacent to the conductor pattern composite is formed on the ceramic substrate so that the conductor pattern composite is flush with the insulating layer.

5. The method for manufacturing a ceramic substrate according to claim 1, wherein the insulating layer adjacent to the conductor pattern composite is formed on the ceramic substrate so that the insulating layer overlaps a part of the conductor pattern composite.

6. The method for manufacturing a ceramic substrate according to claim 1, wherein the conductor pattern composite is provided on a via of the ceramic substrate.

7. The method for manufacturing a ceramic substrate according to claim 1, wherein the insulating layer material comprises an inorganic component and a resin composition.

8. The method for manufacturing a ceramic substrate according to claim 7, wherein the inorganic component comprises $SiO_2$ or $AlO_3$.

9. The method for manufacturing a ceramic substrate according to claim 7, wherein the resin composition comprises at least one selected from a fluorine-based resin, a silicon-based resin, an imide-based resin, and an epoxy-based resin.

10. The method for manufacturing a ceramic substrate according to claim 1, wherein the conductor pattern composite comprises Ag, Cu, or Au particles.

11. The method for manufacturing a ceramic substrate according to claim 10, wherein the Ag, Cu, or Au particles comprise Ag, Cu, or Au particles of 10 to 100 nm.

* * * * *